(12) United States Patent
Cho et al.

(10) Patent No.: US 7,397,681 B2
(45) Date of Patent: Jul. 8, 2008

(54) NONVOLATILE MEMORY DEVICES HAVING ENHANCED BIT LINE AND/OR WORD LINE DRIVING CAPABILITY

(75) Inventors: Beak-hyung Cho, Gyeonggi-do (KR); Du-eung Kim, Gyeonggi-do (KR); Choong-keun Kwak, Gyeonggi-do (KR); Hyung-rok Oh, Gyeonggi-do (KR); Woo-yeong Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/348,432

(22) Filed: Feb. 6, 2006

(65) Prior Publication Data

US 2006/0215440 A1 Sep. 28, 2006

(30) Foreign Application Priority Data

Mar. 24, 2005 (KR) .................. 10-2005-0024541

(51) Int. Cl.
*G11C 27/00* (2006.01)

(52) U.S. Cl. .................. 365/46; 365/100; 365/148

(58) Field of Classification Search .................. 365/46, 365/100, 148, 171
See application file for complete search history.

(56) References Cited

U.S. PATENT DOCUMENTS

| | | | |
|---|---|---|---|
| 4,868,788 A | 9/1989 | Jinbo | |
| 5,337,279 A | 8/1994 | Gregory et al. | |
| 5,753,553 A | 5/1998 | Hikawa et al. | |
| 5,808,500 A | 9/1998 | Kalpakjian | |
| 5,883,827 A | 3/1999 | Morgan | |
| 5,903,488 A | 5/1999 | Tanoi | |
| 5,940,343 A | 8/1999 | Cha et al. | |
| 6,002,635 A | 12/1999 | Matano | |
| 6,026,047 A | 2/2000 | Ryu et al. | |
| 6,031,784 A | 2/2000 | Ong | |
| 6,111,808 A | 8/2000 | Khang et al. | |

(Continued)

FOREIGN PATENT DOCUMENTS

EP 1 326 254 A1 7/2003

(Continued)

OTHER PUBLICATIONS

European Search Report, European Application No. 06004893.1, Sep. 12, 2006.

(Continued)

*Primary Examiner*—Huan Hoang
*Assistant Examiner*—Jason Lappas
(74) *Attorney, Agent, or Firm*—Myers Bigel Sibley & Sajovec (57) ABSTRACT

Phase-changeable random access memory (PRAM) devices include a plurality of rows and columns of PRAM memory cells therein and at least one local bit line electrically coupled to a column of the PRAM memory cells. First and second bit line selection circuits are provided to increase the rate at which the at least one local bit line can be accessed and driven with a bit line signal. These first and second bit line selection circuits are configured to electrically connect first and second ends of the at least one local bit line to a global bit line during an operation to read data from a selected one of the PRAM memory cells in the column.

7 Claims, 7 Drawing Sheets

U.S. PATENT DOCUMENTS

| | | |
|---|---|---|
| 6,229,755 B1 | 5/2001 | Oh |
| 6,249,477 B1 | 6/2001 | Ohtsuki |
| 6,314,014 B1 | 11/2001 | Lowrey et al. |
| 6,456,524 B1 * | 9/2002 | Perner et al. ............... 365/158 |
| 6,477,105 B2 | 11/2002 | Aritomi et al. |
| 6,480,438 B1 | 11/2002 | Park |
| 6,487,113 B1 | 11/2002 | Park et al. |
| 6,545,903 B1 | 4/2003 | Wu |
| 6,735,104 B2 | 5/2004 | Scheuerlein |
| 6,768,655 B1 | 7/2004 | Parkinson et al. |
| 6,778,421 B2 | 8/2004 | Tran |
| 6,791,867 B2 | 9/2004 | Tran |
| 6,850,432 B2 | 2/2005 | Lu et al. |
| 6,937,505 B2 | 8/2005 | Morikawa |
| 6,954,398 B2 | 10/2005 | Ninomiya et al. |
| 7,009,908 B2 | 3/2006 | Fischer |
| 7,027,342 B2 | 4/2006 | Inoue |
| 7,123,535 B2 | 10/2006 | Kurotsuchi et al. |
| 7,215,592 B2 | 5/2007 | Cho et al. |
| 2003/0002338 A1 | 1/2003 | Xu et al. |
| 2003/0043620 A1 * | 3/2003 | Ooishi ..................... 365/171 |
| 2003/0081445 A1 | 5/2003 | Van Brocklin et al. |
| 2003/0123284 A1 | 7/2003 | Lowrey et al. |
| 2003/0133325 A1 | 7/2003 | Silvagni et al. |
| 2003/0174530 A1 | 9/2003 | Tran |
| 2004/0246808 A1 | 12/2004 | Cho et al. |
| 2005/0030814 A1 | 2/2005 | Oh et al. |
| 2005/0068804 A1 | 3/2005 | Choi et al. |
| 2005/0270883 A1 | 12/2005 | Cho et al. |
| 2006/0120148 A1 | 6/2006 | Kim et al. |
| 2006/0215480 A1 | 9/2006 | Kim et al. |
| 2006/0268594 A1 * | 11/2006 | Toda ....................... 365/100 |
| 2006/0285380 A1 | 12/2006 | Cho et al. |
| 2006/0291277 A1 | 12/2006 | Cho et al. |

FOREIGN PATENT DOCUMENTS

| | | |
|---|---|---|
| JP | 2002-203392 | 7/2002 |
| JP | 2004-110867 | 4/2004 |
| KR | 1020000027267 A | 5/2000 |
| KR | 1020040074088 | 8/2004 |

OTHER PUBLICATIONS

European Search Report, European Application No. 06004893.1—2210, Jan. 16, 2007.

"A 0.18 μm 3.0V 64 Mb Non-Volatile Phase-Transition Random-Access Memory (PRAM)," 2004 IEEE International Solid-State Circuits Conference, ISSCC 2004/Session 2/Non-Volatile Memory/2.1, Feb. 16, 2004, pp. 1-3.

Kang-Deog Suh et al., "A 3.3V 32Mb NAND Flash Memory with Incremental Step Pulse Programming Scheme," IEEE International Solid-State Circuits Conference, Digest of Technical Papers, Dec. 30, 1995.

* cited by examiner

NONVOLATILE MEMORY DEVICES HAVING ENHANCED BIT LINE AND/OR WORD LINE DRIVING CAPABILITY

REFERENCE TO PRIORITY APPLICATION

This application claims priority to Korean Application No. 2005-0024541, filed Mar. 24, 2005, the disclosure of which is hereby incorporated herein by reference.

FIELD OF THE INVENTION

The present invention relates to integrated circuit memory devices and, more particularly, to nonvolatile memory devices.

BACKGROUND OF THE INVENTION

One class of nonvolatile memory devices includes phase-changeable random access memory (PRAM) devices, which offer many advantageous electrical characteristics relative to FLASH, SRAM and DRAM memory devices. PRAM devices support non-volatile data storage, random access addressing and relatively high speed read and write operations. PRAM devices may also be configured to have relatively low power consumption requirements.

The nonvolatile characteristics of the PRAM devices may be provided by configuring each memory cell with a chalcogenide alloy (e.g., GST: $Ge_2Sb_2Te_5$) having programmable resistivity characteristics. For example, during a write/programming operation, the chalcogenide alloy within a memory cell may undergo resistive heating to thereby alter the resistivity of the chalcogenide alloy and cause the memory cell to be "set" into one logic state or "reset" into another logic state.

Figure 1:
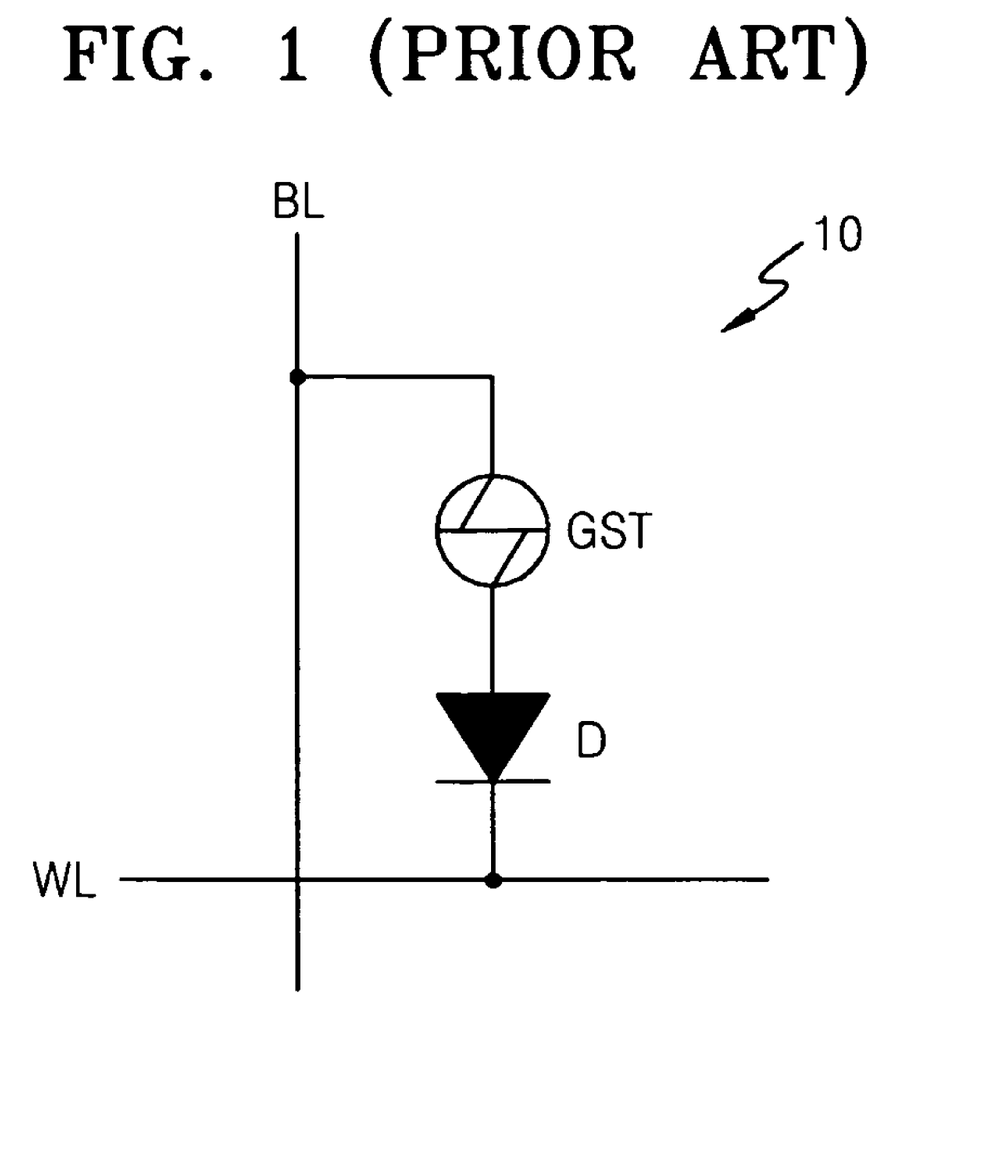
FIG. 1 is an electrical schematic of a conventional diode-type PRAM cell.

FIG. 1 illustrates a conventional diode-type PRAM cell 10, which is electrically coupled to respective bit and word lines (BL and WL). In this PRAM cell 10, the chalcogenide alloy (e.g., GST alloy) may be programmed to have a relatively high resistance state (high-R state) or a relatively low resistance state (low-R state). This state may be detected during a reading operation by biasing the bit line BL at a higher voltage relative to the word line to thereby establish a forward current path through the PRAM cell 10. The magnitude of the established current (e.g., bit line current) in the forward current path is measured to determine the state (high-R or low-R) of the cell 10.

Figure 2:
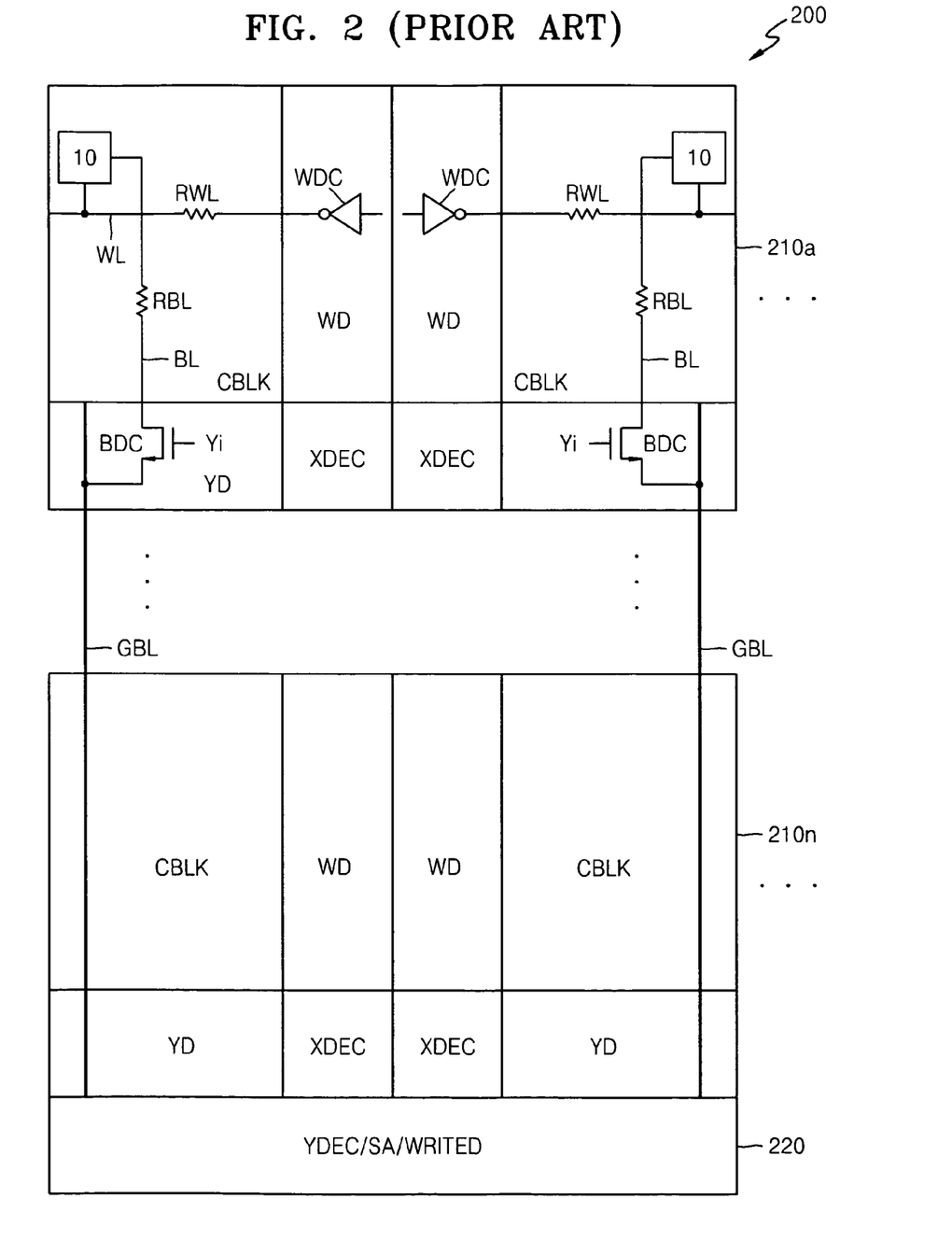
FIG. 2 is an electrical schematic of a conventional memory device having a plurality of PRAM memory blocks therein that are electrically connected to a column decoder/driver circuit.

FIG. 2 illustrates a conventional memory device 200 having a plurality of PRAM memory blocks 210a-210n therein that are electrically coupled to a column decoder/driver circuit 220. Each of these PRAM memory blocks 210a-210n is illustrated as including a plurality of memory cell blocks (CBLK), word line drivers (WD), row decoders (XDEC) and local bit line selection circuits (YD) therein. Each memory cell block (CBLK) includes a two-dimensional array of PRAM cells 10 (C) spanning multiple columns and rows. Each row within the cell block (CBLK) is associated with a corresponding local word line (WL) and each column is associated with a corresponding local bit line (BL). The word lines are driven by a word line driver (WDC), which is shown as an inverter having an output electrically coupled to one end of a local word line (WL). The local bit lines (BL) are electrically coupled to a bit line selection circuit (BDC), which is shown as an NMOS transistor having a gate terminal responsive to a column selection signal Yi and a source terminal electrically coupled to a corresponding global bit line (GBL). The global bit lines (GBL) are controlled by the column decoder/driver circuit 220, containing a column decoder (YDEC), sense amplifier (SA) and write driver (WRITED) therein. Because the size of each memory cell block (CBLK) is a function of the drive characteristics of each word line driver (WD) and bit line selection circuit (YD), the resistance of each local word line (RWL) and the resistance of each local bit line (RBL) may indirectly influence the capacity of the memory device 200 for a given layout area.

To improve PRAM device performance, some techniques have been developed to reduce local word line resistance. One such technique is disclosed in U.S. Patent Publication No. 2005/0270883 to Cho et al., entitled "Memory Device with Reduced Word Line Resistance". As illustrated by FIG. 4 of Cho et al., a relatively long global word line may be replaced by a plurality of shorter local word lines (e.g., LWL0, LWL1 and LWL2) that are connected to respective pull-down switching devices (e.g., NMOS transistors N101, N102, N103, . . . , N106). These pull-down switching devices have gate terminals responsive to global word line signals (e.g., SWL0, SWL1 and SWL2). An additional technique is disclosed in U.S. Pat. No. 6,480,438 to Park, entitled "Providing Equal Cell Programming Conditions Across a Large and High Density Array of Phase-Change Memory Cells." In the '438 patent, bit line and word line compensation circuits are used to minimize resistance variations across the cells of an array to thereby provide equivalent cell programming conditions. Additional PRAM devices are disclosed in an article by W. Y. Cho et al., entitled "A 0.18 um 3.0V 64 Mb Non-Volatile Phase-Transition Random-Access Memory (PRAM)", Digest of the IEEE International Solid-State Circuits Conference, Session 2, Paper 2.1, pp. 1-2, Feb. 16, 2004. U.S. Pat. No. 6,791,867 to Tran, entitled "Selection of Memory Cells in Data Storage Devices", discloses a non-volatile memory device having memory cells therein with programmable resistance states and shunt elements connected in series within controlled current paths. Additional PRAM devices are disclosed in: U.S. Patent Publication No. 2005/0030814 to Oh et al., entitled "Data Read Circuit for Use in a Semiconductor Memory and Method Thereof", U.S. Patent Publication No. 2004/0246808 to Cho et al., entitled "Writing Driver Circuit of Phase-Change Memory" and U.S. Pat. No. 6,487,113 to Park et al., entitled "Programming a Phase-Change Memory with Slow Quench Time".

SUMMARY OF THE INVENTION

Embodiments of the present invention include phase-changeable random access memory (PRAM) devices having enhanced bit line and/or word line driving capability that supports high bit line and/or word line slew rates during programming and reading operations. These embodiments include a PRAM memory array having a plurality of rows and columns of PRAM memory cells therein and at least one local bit line electrically coupled to a column of PRAM memory cells in the PRAM memory array. First and second bit line selection circuits are also provided to increase the rate at which the at least one local bit line can be accessed and driven with a bit line signal. These first and second bit line selection circuits are configured to electrically connect first and second ends of the local bit line to a global bit line during an operation to read data from a selected one of the PRAM memory cells in the column. The first and second bit line selection circuits are further configured to electrically connect the first and second ends of the local bit line to the global bit line during an operation to write data to a selected one of the PRAM memory cells in the column. The first and second bit line selection circuits are responsive to equivalent column selection signals.

Still further embodiments of the present invention include a phase-changeable random access memory (PRAM) device having at least one local word line electrically coupled to a row of PRAM memory cells in a PRAM memory array and first and second word line driver circuits. The first and second word line driver circuits are electrically connected to first and second spaced-apart nodes on the local word line, respectively. The first and second word line driver circuits are configured to drive the first and second spaced-apart nodes at the same voltage level during an operation to read data from a selected one of the PRAM memory cells in the row. In some of these embodiments, the first and second word line driver circuits are electrically connected to a global word line. In additional embodiments of the invention, the local word line spans multiple PRAM memory arrays and the first and second spaced-apart nodes are located at intermediate points along the local word line.

Still further embodiments of the present invention include a phase-changeable random access memory (PRAM) device having a PRAM memory array of diode-controlled PRAM memory cells therein. At least one local word line and at least one local bit line are provided in the array. The at least one local word line is electrically coupled to a row of diode-controlled PRAM memory cells in the PRAM memory array and the at least one local bit line is electrically coupled to a column of diode-controlled PRAM memory cells in the PRAM memory array. First and second bit line selection circuits are provided, which are configured to electrically connect first and second ends of the local bit line to a global bit line during an operation to read data from a selected one of the diode-controlled PRAM memory cells in the column. First and second word line driver circuits are also provided, which are electrically connected to first and second spaced-apart nodes on the local word line, respectively. These first and second word line driver circuits are configured to drive the first and second spaced-apart nodes at the same voltage level during an operation to read data from a selected one of the diode-controlled PRAM memory cells in the row. The first and second bit line selection circuits are further configured to electrically connect the first and second ends of the local bit line to the global bit line during an operation to write data to a selected one of the PRAM memory cells in the column. The first and second bit line selection circuits are responsive to equivalent column selection signals. The first and second spaced-apart nodes may be located at opposing ends of the local word line. Alternatively, when the local word line spans multiple PRAM memory arrays, the first and second spaced-apart nodes may be located at intermediate points along the local word line.

DETAILED DESCRIPTION OF PREFERRED EMBODIMENTS

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals.

Figure 3:
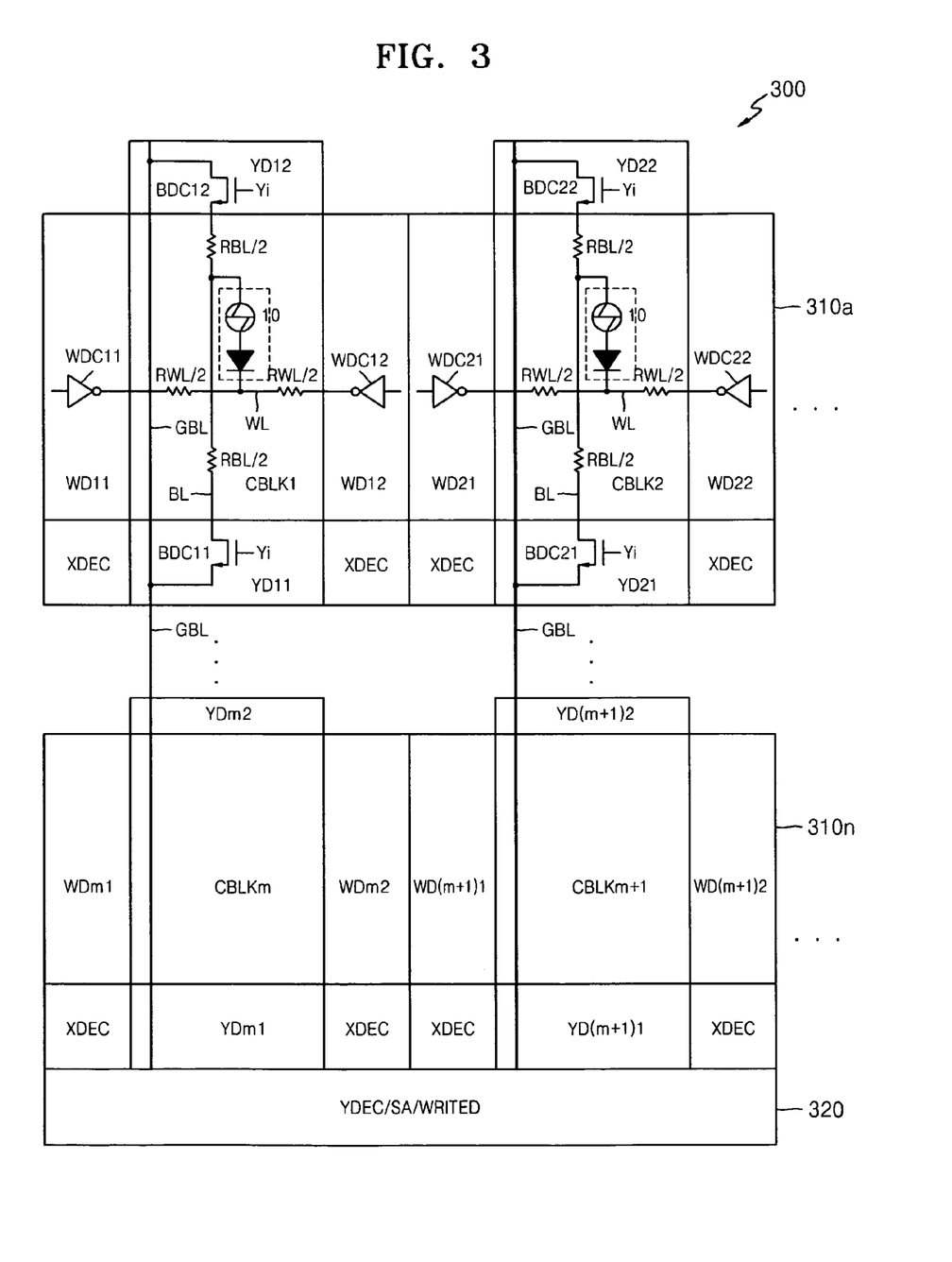
FIG. 3 is an electrical schematic of a multi-block PRAM device according to a first embodiment of the present invention.

Referring now to FIG. 3, a multi-block PRAM device 300 according to a first embodiment of the present invention is illustrated as including a plurality of PRAM memory blocks 310a-310n that are electrically coupled to a column decoder/driver circuit 320. Each of these PRAM memory blocks 310a-310n is illustrated as including a plurality of memory cell blocks ((CBLK1, CBLK2, . . . ) and (CBLKm, CBLK(m+1), . . . )). Each of these memory cell blocks is electrically coupled to a corresponding pair of word line driver circuits (WD), a pair of row decoders (XDEC) and a pair of local bit line selection circuits (YD) therein. In particular, the first memory cell block CBLK1 is electrically coupled in a row direction to a left side word line driver circuit (WD11) and a right side word line driver circuit (WD12). In addition, the first memory cell block CBLK1 is electrically coupled in a column direction to a bottom bit line selection circuit (YD11) and a top bit line selection circuit (YD12). A pair of row decoders XDEC are also provided. These row decoders XDEC generate word line driver signals in response to an applied row address.

The first memory cell block CBLK1 includes a two-dimensional array of PRAM cells 10 containing a plurality of rows and columns. These PRAM cells 10 are illustrated as diode-type PRAM cells, however, transistor-controlled PRAM cells (not shown) may also be used. Each column of PRAM cells 10 is coupled to a corresponding local bit line BL and each row of PRAM cells 10 is coupled to a corresponding word line WL. The resistance of each local bit line BL may equal RBL (½RBL+½RBL) and the resistance of each local word line WL may equal RWL (½RWL+½RWL).

As further illustrated by FIG. 3, each word line is driven by a corresponding pair of word line drivers, which are connected at opposing ends of the respective word line. In particular, the illustrated word line WL is driven by a left side word line driver (WDC11) and a right side word line driver (WDC12). These drivers are illustrated as inverters. Moreover, each local bit line is driven by a corresponding pair of bit line selection devices, which are connected at opposing ends of the respective local bit line. In particular, the illustrated bit line BL is driven by a bottom bit line selection device BDC11 and a top bit line selection device BDC12. These bit line selection devices are illustrated as NMOS transistors having gate terminals responsive to equivalent column selection signals Yi generated within bottom and top bit line selection circuits (YD11, YD12). The drain terminals of the NMOS transistors are connected to a corresponding global bit line GBL, which is controlled by a column decoder/driver circuit 320. The column decoder/driver circuit 320 may be of conventional design.

Similarly, the second memory cell block CBLK2 includes a two-dimensional array of PRAM cells 10 containing a plurality of rows and columns of PRAM cells 10. The second memory cell block CBLK2 is electrically coupled in a row direction to a left side word line driver circuit (WD21) and a right side word line driver circuit (WD22). The second memory cell block CBLK2 is electrically coupled in a column direction to a bottom bit line selection circuit (YD21) and a top bit line selection circuit (YD22). In particular, the illustrated word line WL is driven by a left side word line driver (WDC21) and a right side word line driver (WDC22). The illustrated bit line BL is driven by a bottom bit line selection device BDC21 and a top bit line selection device BDC22. These bit line selection devices are illustrated as NMOS transistors having gate terminals responsive to equivalent column selection signals Yi generated within bottom and top bit line selection circuits (YD21, YD22). The drain terminals of the NMOS transistors are connected to a corresponding global bit line GBL, which is controlled by a column decoder/driver circuit 320. The memory cell blocks CBLKm and CBLK(m+1) within the PRAM memory block 310n are configured in a similar manner to the first and second memory cell blocks CBLK1 and CBLK2.

Referring again to the first memory cell block CBLK1, the bottom bit line selection circuit (YD11) and the top bit line selection circuit (YD12) are configured to electrically connect first and second ends of the local bit line BL to a global bit line GBL during an operation to read data from (or write data to) a selected one of the PRAM memory cells 10 in the corresponding column. This electrical connection is provided by the bottom bit line selection device BDC11 and the top bit line selection device BDC12 when the corresponding column selection signal Yi is switched low-to-high. This dual connection of opposing ends of the local bit line BL to the corresponding global bit line GBL during reading and programming (i.e., writing) operations increases the slew rate of the local bit line signal by reducing the effective resistance of the local bit line BL as seen by the bit line selection devices. This reduction in effective resistance enables the local bit line BL to be longer for a given read/write access time. This ability to support longer local bit lines by using a pair of bit line selection devices on opposing ends of the local bit line enables the use of larger memory cell blocks (e.g., more rows of memory cells).

In a similar manner, the illustrated left side word line driver (WDC11) and a right side word line driver (WDC12) are configured to drive opposing ends of the corresponding local word line WL at the same voltage level during an operation to read data from (or write data to) a selected one of the PRAM memory cells 10 in the row. This dual connection of opposing ends of the local bit line WL during reading and programming (i.e., writing) operations increases the slew rate of the local word line signal and enables the local word line WL to be longer for a given read/write access time. This ability to support longer local word lines by using a pair of word line drivers on opposing ends of the word line enables the use of larger memory cell blocks (e.g., more columns of memory cells).

Figure 4:
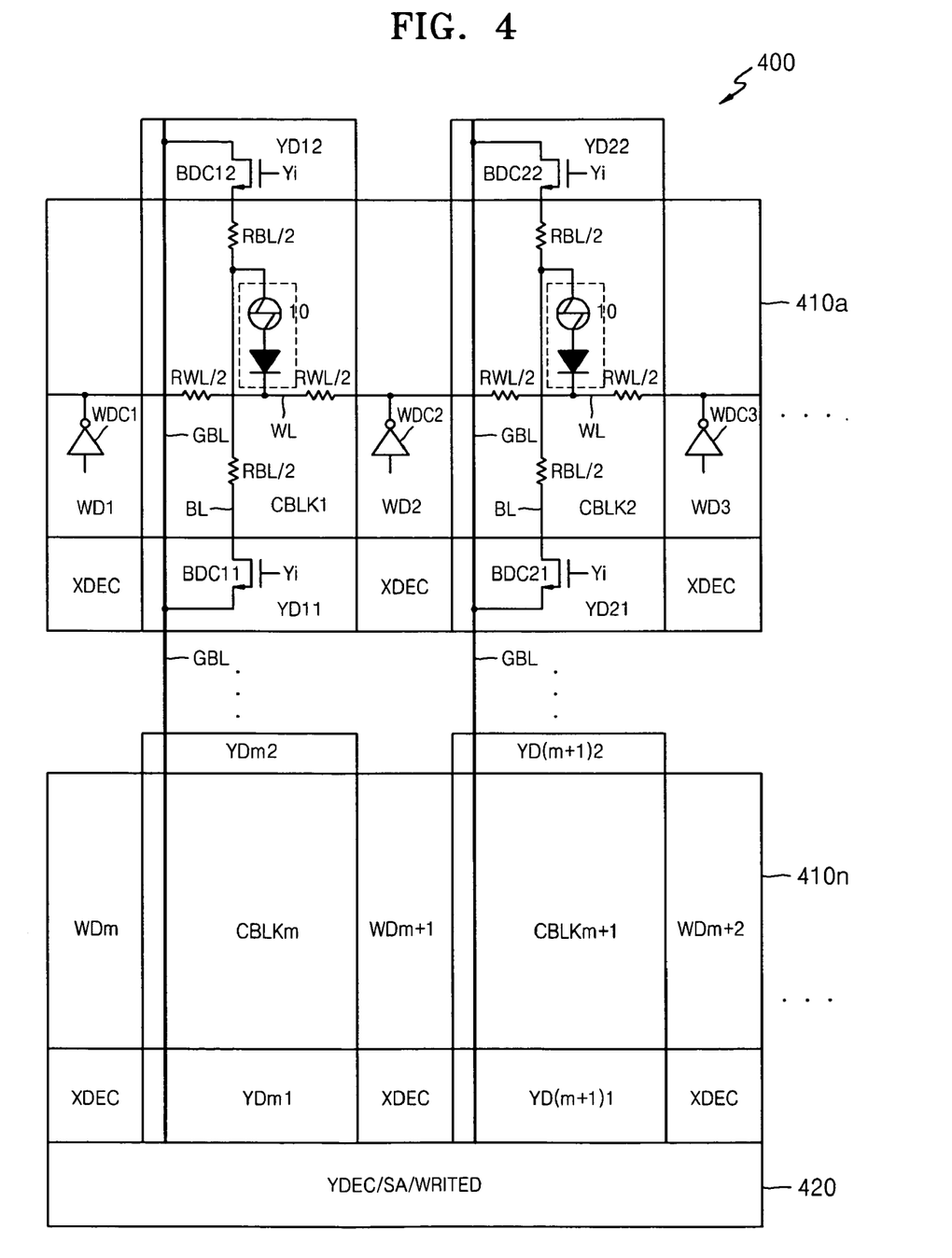
FIG. 4 is an electrical schematic of a multi-block PRAM device according to a second embodiment of the present invention.

Referring now to FIG. 4, a multi-block PRAM device 400 according to a second embodiment of the present invention is illustrated as including a plurality of PRAM memory blocks 410a-410n that are electrically coupled to a column decoder/driver circuit 420. These PRAM memory blocks 410a-410n are essentially identical to the PRAM memory blocks 310a-310n, however, the word line driver circuits WD11, WD12, WD21, WD22, WDm1, WDm2, WD(m+1)1 and WD(M+1)2 illustrated by FIG. 3 are replaced by the following word line driver circuits: WD1, WD2, WD3, WDm, WD(m+1) and WD(m+2). These word line driver circuits include drivers (e.g., WDC1, WDC2, WDC3, . . . ) having outputs connected to intermediate and spaced-apart nodes of a word line that spans multiple memory cell blocks.

Figure 5:
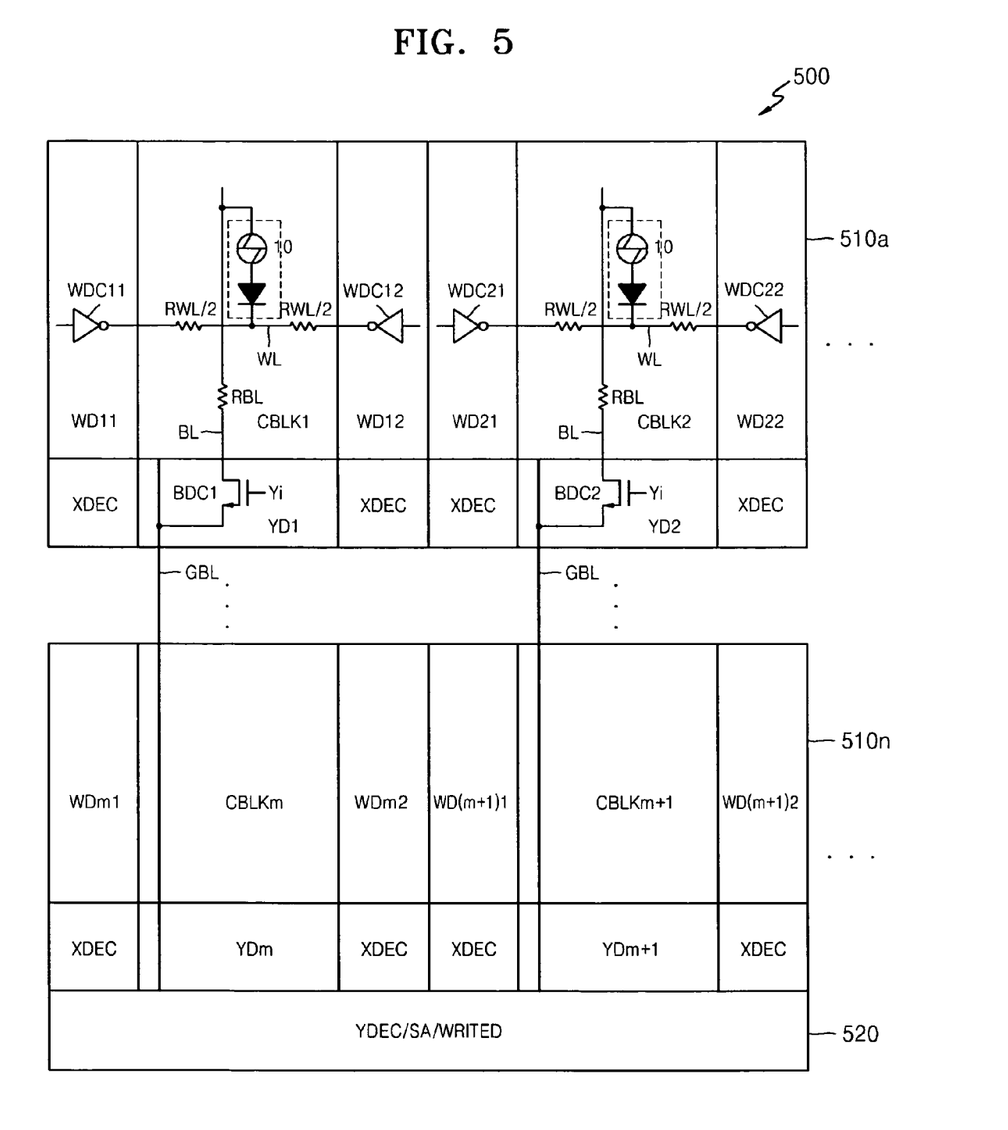
FIG. 5 is an electrical schematic of a multi-block PRAM device according to a third embodiment of the present invention.

Referring now to FIG. 5, a multi-block PRAM device 500 according to a third embodiment of the present invention is illustrated as including a plurality of PRAM memory blocks 510a-510n that are electrically coupled to a column decoder/driver circuit 520. These PRAM memory blocks 510a-510n are similar to the PRAM memory blocks 310a-310n, however, the pairs of bit line selection circuits ((YD11, YD12), (YD21, YD22), . . . ) are replaced by single-sided bit line selection circuits (YD1, YD2, . . . , YDm, YD(m+1) . . . ) containing respective bit line selection devices (e.g., BDC1, BDC2, . . . ).

Figure 6:
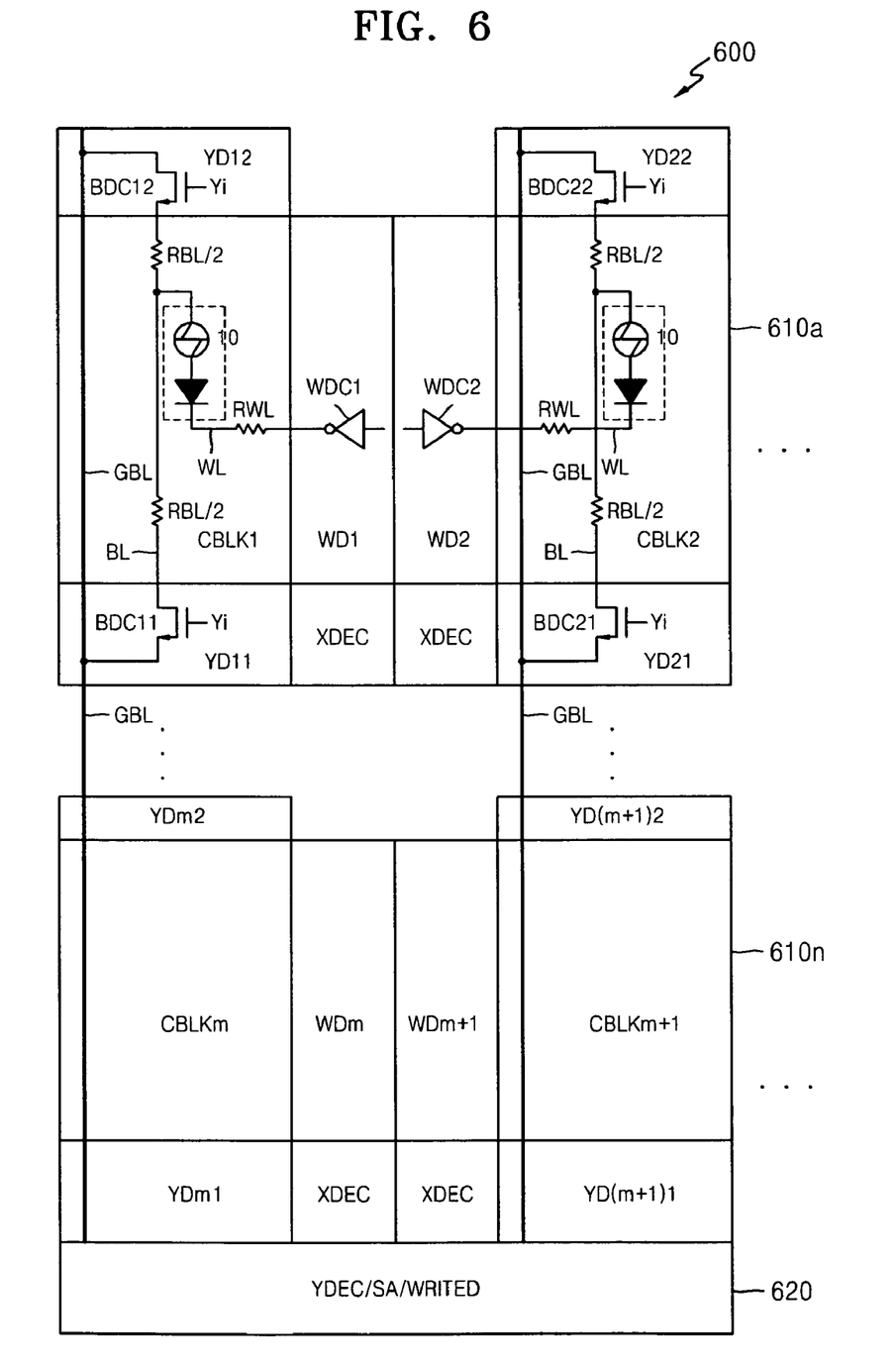
FIG. 6 is an electrical schematic of a multi-block PRAM device according to a fourth embodiment of the present invention.
Figure 7:
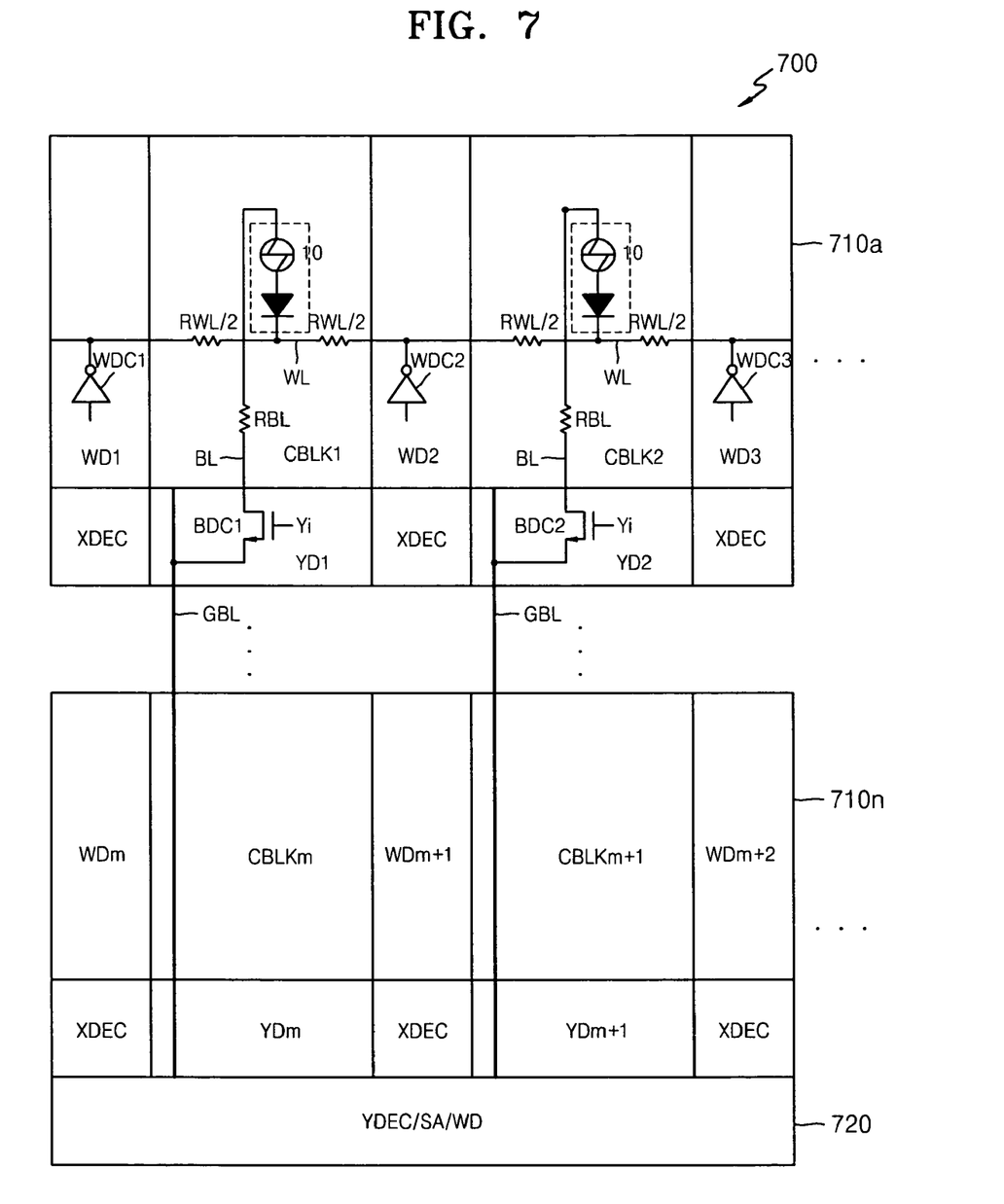
FIG. 7 is an electrical schematic of a multi-block PRAM device according to a fifth embodiment of the present invention.

Referring now to FIG. 6, a multi-block PRAM device 600 according to a fourth embodiment of the present invention is illustrated as including a plurality of PRAM memory blocks 610a-610n that are electrically coupled to a column decoder/driver circuit 620. These PRAM memory blocks 610a-610n are similar to the PRAM memory blocks 310a-310n of FIG. 3, however, the pairs of word line driver circuits (WD11, WD12) and (WD21, WD22) illustrated by FIG. 3 are replaced by single-sided word line driver circuits WD1, WD2, WDm, WD(m+1), . . . having respective word line drivers therein (e.g., WDC1, WDC2, . . . ). Finally, as illustrated by FIG. 7, which illustrates a multi-block PRAM device 700 according to a fifth embodiment of the present invention, the plurality of PRAM memory blocks 410a-410n illustrated by FIG. 4 are replaced by PRAM memory blocks 710a-710n, which are electrically coupled to a column decoder/driver circuit 720. The PRAM memory blocks 710a-710n are similar to the PRAM memory blocks 410a-410n, however, the pairs of bit line selection circuits ((YD11, YD12), (YD21, YD22), . . . ) are replaced by single-sided bit line selection circuits (YD1, YD2, . . . ) containing respective bit line selection devices (e.g., BDC1, BDC2, . . . ).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:
1. An integrated circuit memory device, comprising:
a memory array have a plurality of columns of PRAM cells therein;
a local bit line electrically coupled to a first one of the plurality of columns of PRAM cells; and
first and second bit line selection circuits configured to electrically connect first and second portions of said local bit line, respectively, to a global bit line during an operation to read data from a selected one of the PRAM cells in the first one of the plurality of columns of PRAM cells.

2. The memory device of claim 1, wherein the first and second portions of said local bit line are first and second ends of said local bit line, respectively.

3. The memory device of claim 2, wherein said first and second bit line selection circuits are further configured to electrically connect the first and second ends of said local bit line to the global bit line during an operation to write data to the selected one of the PRAM cells.

4. The memory device of claim 3, wherein said first and second bit line selection circuits are responsive to equivalent column selection signals.

5. The memory device of claim 1, wherein the PRAM cells are selected from a group consisting of diode-controlled PRAM cells and transistor-controlled PRAM cells.

6. The memory device of claim 1, wherein said memory array includes a row of PRAM cells therein and a local word line electrically coupled to the row of PRAM cells; and wherein the memory device further comprises first and second word line driver circuits electrically connected to first and second spaced-apart nodes on the local word line, respectively, said first and second word line driver circuits configured to drive the first and second spaced-apart nodes at the same voltage level during an operation to read data from a selected one of the PRAM cells in the row.

7. The memory device of claim 6, wherein the first and second spaced-apart nodes are located at opposing ends of the local word line.

* * * * *